（12） United States Patent
Ye

(10) Patent No.: US 9,874,796 B2
(45) Date of Patent: Jan. 23, 2018

(54) BOA LIQUID CRYSTAL PANEL

(71) Applicant: Shenzhen China Star Optoelectronics Technology Co., Ltd., Shenzhen (CN)

(72) Inventor: Chengliang Ye, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 249 days.

(21) Appl. No.: 14/888,440

(22) PCT Filed: Oct. 12, 2015

(86) PCT No.: PCT/CN2015/091725
§ 371 (c)(1),
(2) Date: Nov. 1, 2015

(87) PCT Pub. No.: WO2017/035911
PCT Pub. Date: Mar. 9, 2017

(65) Prior Publication Data
US 2017/0160610 A1    Jun. 8, 2017

(30) Foreign Application Priority Data
Sep. 1, 2015  (CN) .......................... 2015 1 0552015

(51) Int. Cl.
*G02F 1/136* (2006.01)
*G02F 1/1362* (2006.01)
*H01L 27/12* (2006.01)
*G02F 1/1343* (2006.01)

(52) U.S. Cl.
CPC .... G02F 1/136209 (2013.01); G02F 1/13439 (2013.01); H01L 27/124 (2013.01)

(58) Field of Classification Search
CPC ........... G02F 1/136209; G02F 1/13439; H01L 27/124
See application file for complete search history.

(56) References Cited

U.S. PATENT DOCUMENTS

| | | | | |
|---|---|---|---|---|
| 5,162,933 A | * | 11/1992 | Kakuda | G02F 1/136213 257/55 |
| 2008/0246720 A1 | * | 10/2008 | Lee | G02F 1/133555 345/96 |
| 2011/0216275 A1 | * | 9/2011 | Lee | G02F 1/1335 349/106 |
| 2015/0062507 A1 | * | 3/2015 | Park | G02F 1/133512 349/106 |

\* cited by examiner

*Primary Examiner* — James Dudek
(74) *Attorney, Agent, or Firm* — Leong C. Lei

(57) ABSTRACT

The present invention provides a BOA liquid crystal panel. Both the color resist layer and the black matrix are located on the second substrate, the borders of the two adjacent color resist blocks in the color resist layer overlap to act the effect of light shielding and on this basis, a layer of black matrix is covered to achieve the double layer shielding, which effectively prevents the light leakage due to the exposure of the gap between the data line and the light shielding line when the BOA liquid crystal panel is applied for curve display and meanwhile, shortens the width of the light shielding line. The aperture ratio of the BOA liquid crystal panel is raised to reduce the cost of the backlight.

13 Claims, 3 Drawing Sheets

BOA LIQUID CRYSTAL PANEL

FIELD OF THE INVENTION

The present invention relates to a display technology field, and more particularly to a BOA liquid crystal panel.

BACKGROUND OF THE INVENTION

The LCD (Liquid Crystal Display) possesses many advantages of being ultra thin, power saved and radiation free. It has been widely utilized in, such as LCDTV, mobile phones, Personal Digital Assistant (PDAs), digital cameras, laptop screens or notebook screens.

Generally, the liquid crystal display comprises a shell, a LCD panel located in the shell and a backlight module located in the shell. Particularly, the structure of the liquid crystal panel mainly comprise a Thin Film Transistor Array Substrate (TFT Array Substrate), a Color Filter Substrate (CF Substrate) and a Liquid Crystal Layer. The working principle is that the light of backlight module is reflected to generate images by applying driving voltages to the two glass substrate for controlling the rotations of the liquid crystal molecules.

Please refer from FIG. 1 to FIG. 2, which shows diagrams while the liquid crystal panels of prior arts are in the curve state. The liquid crystal panel comprises a CF substrate 100, a TFT substrate 200 and a liquid crystal layer 300 between the CF substrate 100 and the TFT substrate 200. The CF substrate 100 comprises a first substrate 110, a color resist layer 120 and a black matrix (BM) 130 located on the first substrate 110. The TFT substrate 200 comprises a second substrate 200, a shielding line 220 and a data line 230. In normal condition, the black matrix 130 can cover the gap between the shielding line 220 and the data line 230 to prevent the light leakage. When the liquid crystal panel is applied for curve display, because of the curvature radius difference of the TFT substrate 200 and the CF substrate 100, the relative position shift occurs between the black matrix 130 on the CF substrate 100 and the film layers on the TFT substrate 200. Thus, the light leakage happens on the curved liquid crystal panel, and in the meantime, a part of the aperture ratio will be lost.

For raising the aperture ratio of the liquid crystal panel and reducing the production costs, people propose a Color filter On Array (COA) technology, in which the RGB color resists at the CF substrate side is transferred to be manufactured on the array substrate, and the previous substrate merely preserves the black matrix, the common electrode and the Photo Spacer (PS).

Please refer from FIG. 3 to FIG. 4, which show the sectional structure diagrams of the COA liquid crystal panel according to prior art. The color resist layer 250' is located on the lower substrate 200'. As shown in FIG. 3, the black matrix 130' of the upper substrate 100' completely covers the gap between the data line 240' and the shielding line 220', and meanwhile extra covers a portion of the shielding line 220'. The range of the shielding line 220' which is extra covered by the black matrix 130' in the horizontal direction is 1-2 μm, which is specifically to be 1.35 μm in the COA liquid crystal panel in FIG. 3. The light leakage issue due to the exposure of the gap caused by alignment shift of the upper, lower substrates 100', 200' can be prevented. However, once the COA liquid crystal panel is applied for curve display, the misalignment distance of the black matrix 130' will become larger than the range which is previously shielded by the black matrix 130', and there still might be chances to cause the light leakage happen. Thus, as shown in FIG. 4, the improvement is required for the COA liquid crystal panel in FIG. 3, to increase the range of the shielding line 220' shielded by the black matrix 130' up to 6-7 μm, which is specifically to be 7 μm in the COA liquid crystal panel in FIG. 4. Although this can prevent the light leakage happening, it will result in the decrease of the aperture ratio.

For preventing the light leakage while the liquid crystal panel is applied for curve display and ensuring the aperture ratio of the liquid crystal panel in the mean time, people propose a BM On Array (BOA) technology, which is also to manufacture the black matrix on the array substrate. Thereby, the bad influences of light leakage, interference brought by the panel bending which the present curve liquid crystal panel faces can be solved. Meanwhile, the aperture ratio of the liquid crystal panel can be ensured.

Please refer to FIG. 5, which is a sectional structure diagram of a BOA liquid crystal panel according to prior art. Both the color resist layer 250" and the black matrix 260" are located on the lower substrate 200". Only the common electrode 120" remains on the upper substrate 100".The black matrix 260" completely covers the gap between the data line 240" and the shielding line 220". Because the maximum alignment shift of the exposure apparatus itself is 3 μm, the black matrix 260" should cover at least 3 μm range of the shielding line 220" for preventing the exposure of the gap between the data line 240" and the shielding line 220". Besides, for avoiding the risk of generating the fringes due to the liquid crystal tilt inside the pixel caused by the uneven appearance because of the shift of the black matrix 260", the spaced distance between the black matrix 260" and the pixel electrode 270" is 3 μm, and meanwhile, the range of the shielding line 220" covered by the pixel electrode 270" in the horizontal direction is 2 μm. In sum, the width of the shielding line 220" is 8 μm. The aperture ratio is saved in comparison with a normal COA liquid crystal panel.

Nevertheless, the width of the shielding line 220" in the BOA liquid crystal panel shown in FIG. 5 is larger, which must influence the aperture ratio to a certain extent. Therefore, there is a need to provide a new BOA liquid crystal panel for raising the aperture ratio of the liquid crystal panel in advance.

SUMMARY OF THE INVENTION

An objective of the present invention is to provide a BOA liquid crystal panel, capable of preventing the light leakage while the liquid crystal panel is applied for curve display and meanwhile possessing the higher aperture ratio.

For realizing the aforesaid objective, the present invention provides a BOA liquid crystal panel, comprising an upper substrate, a lower substrate oppositely located to the upper substrate and a liquid crystal layer located between the upper substrate and the lower substrate;

the upper substrate comprises a first substrate, and a common electrode located on the first substrate;

the lower substrate comprises a second substrate, a light shielding line, a data line, a color resist layer covering the data line, a black matrix located on the color resist layer and a pixel electrode;

the color resist layer comprises a red color resist block, a green color resist block and a blue color resist block located in sequence, and borders of two adjacent color resist blocks overlap with each other, and the data line is located at a joint position of the two adjacent color resist blocks; the data line and the light shielding line are spaced with each other in a horizontal direction, and the black matrix completely covers a gap between the data line and the light shielding line and covers a portion of the light shielding line.

A range of the light shielding line covered by the black matrix in the horizontal direction is 1.5 µm.

The pixel electrode and the black matrix are spaced with each other in the horizontal direction.

A distance of the black matrix and the pixel electrode in the horizontal direction is 3 µm.

The light shielding line is located at a position of the gap between the black matrix and the pixel electrode in the horizontal direction.

The pixel electrode covers a portion of the light shielding line.

A range of the light shielding line covered by the pixel electrode in the horizontal direction is 2 µm.

A width of the light shielding line is 6.5 µm.

The first substrate, the second substrate are glass substrates.

Material of the common electrode and the pixel electrode is ITO.

The present invention further provides a BOA liquid crystal panel, comprising an upper substrate, a lower substrate oppositely located to the upper substrate and a liquid crystal layer located between the upper substrate and the lower substrate;

the upper substrate comprises a first substrate, and a common electrode located on the first substrate;

the lower substrate comprises a second substrate, a light shielding line, a data line, a color resist layer covering the data line, a black matrix located on the color resist layer and a pixel electrode;

the color resist layer comprises a red color resist block, a green color resist block and a blue color resist block located in sequence, and borders of two adjacent color resist blocks overlap with each other, and the data line is located at a joint position of the two adjacent color resist blocks; the data line and the light shielding line are spaced with each other in a horizontal direction, and the black matrix completely covers a gap between the data line and the light shielding line and covers a portion of the light shielding line;

wherein a range of the light shielding line covered by the black matrix in the horizontal direction is 1.5 µm;

wherein the pixel electrode and the black matrix are spaced with each other in the horizontal direction;

wherein the pixel electrode covers a portion of the light shielding line;

wherein a width of the light shielding line is 6.5 µm;

wherein the first substrate, the second substrate are glass substrates;

wherein material of the common electrode and the pixel electrode is ITO.

The benefits of the present invention are: in the BOA liquid crystal panel of the present invention, both the color resist layer and the black matrix are located on the second substrate, the borders of the two adjacent color resist blocks in the color resist layer overlap to act the effect of light shielding and on this basis, a layer of black matrix is covered to achieve the double layer shielding, which effectively prevents the light leakage due to the exposure of the gap between the data line and the light shielding line when the BOA liquid crystal panel is applied for curve display and meanwhile, shortens the width of the light shielding line. The aperture ratio of the BOA liquid crystal panel is raised to reduce the cost of the backlight.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 6:
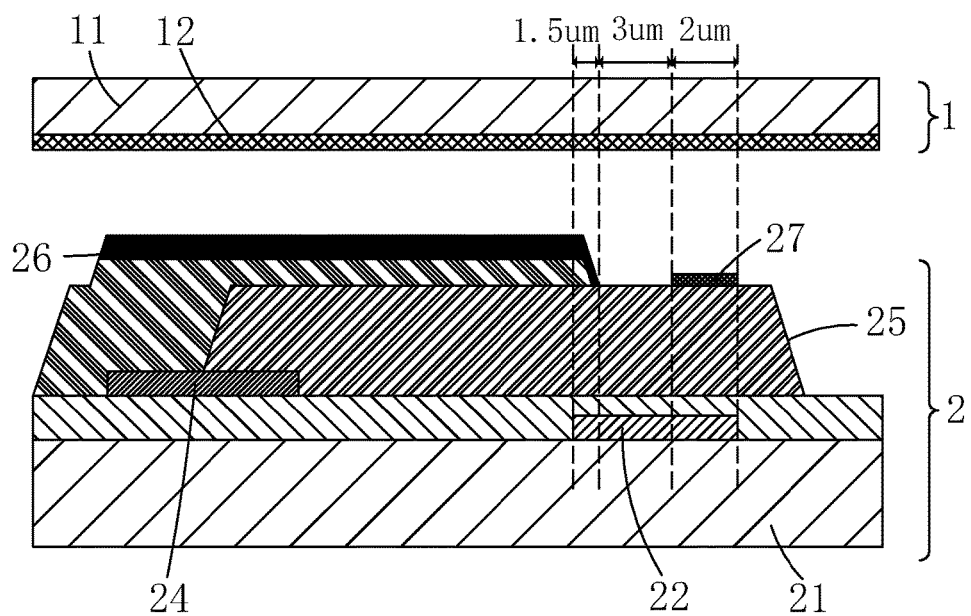
FIG. 6 is a sectional structure diagram of a BOA liquid crystal panel according to present invention.

Please refer to FIG. 6. The present invention provides a BOA liquid crystal display panel, comprising an upper substrate 1, a lower substrate 2 oppositely located to the upper substrate 1 and a liquid crystal layer (not shown) located between the upper substrate 1 and the lower substrate 2.

Specifically, the upper substrate 1 comprises a first substrate 11, and a common electrode 12 located on the first substrate 11.

Specifically, the lower substrate 2 comprises a second substrate 21, a light shielding line 22, a data line 24, a color resist layer 25 covering the data line 24, a black matrix 26 located on the color resist layer 25 and a pixel electrode 27.

Specifically, the color resist layer 25 comprises a red color resist block, a green color resist block and a blue color resist block located in sequence, and borders of two adjacent color resist blocks overlap with each other, and the data line 24 is located at a joint position of the two adjacent color resist blocks; the data line 24 and the light shielding line 22 are spaced with each other in a horizontal direction, and the black matrix 26 completely covers a gap between the data line 24 and the light shielding line 22 and covers a portion of the light shielding line 22. In the BOA liquid crystal panel, borders of two adjacent color resist blocks in the color resist layer overlap with each other to act the effect of light shielding. On this basis, a layer of black matrix 26 is covered. With the double layer shielding, the exposure probability that the gap between the data line 24 and the light shielding line 22 can be reduced about 50%.

Specifically, the overlapping area of the two adjacent color resist blocks and the border of the black matrix 26 correspond with each other.

Specifically, a range of the light shielding line 22 covered by the black matrix 26 in the horizontal direction is 1.5 µm to prevent the light leakage due to the exposure of the gap between the data line 24 and the light shielding line 22 caused by apparatus alignment shift. Before manufacturing the black matrix 26, the overlapping area of the two adjacent color resist blocks on the lower substrate 2 has already covered the light shielding line 22. Thus, as designing the range of the light shielding line 22 covered by the black matrix 26 in the horizontal direction, the setting part of considering the apparatus alignment shift can be omitted, i.e. the range of the light shielding line 22 covered by the black matrix 26 in the horizontal direction can be shortened from 3 μm to 1.5 μm. Then, the width of the light shielding line 22 can be shortened 1.5 μm, and the pixel electrode 27 can be shifted to toward the black matrix 26 with 1.5 μm. Thus, the aperture ratio of the BOA liquid crystal panel can be raised.

Figure 1:
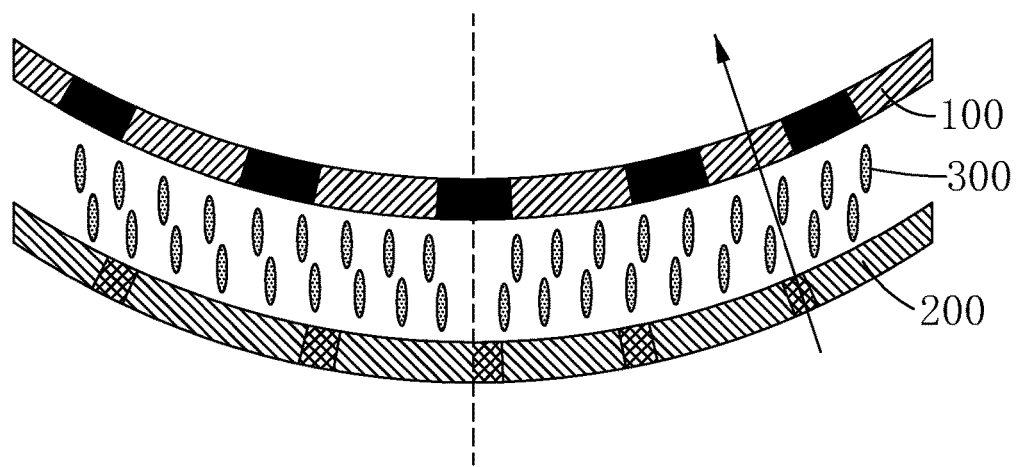
FIG. 1 is a sectional structure diagram of a liquid crystal panel according to prior art when it is applied for curve display.
Figure 2:
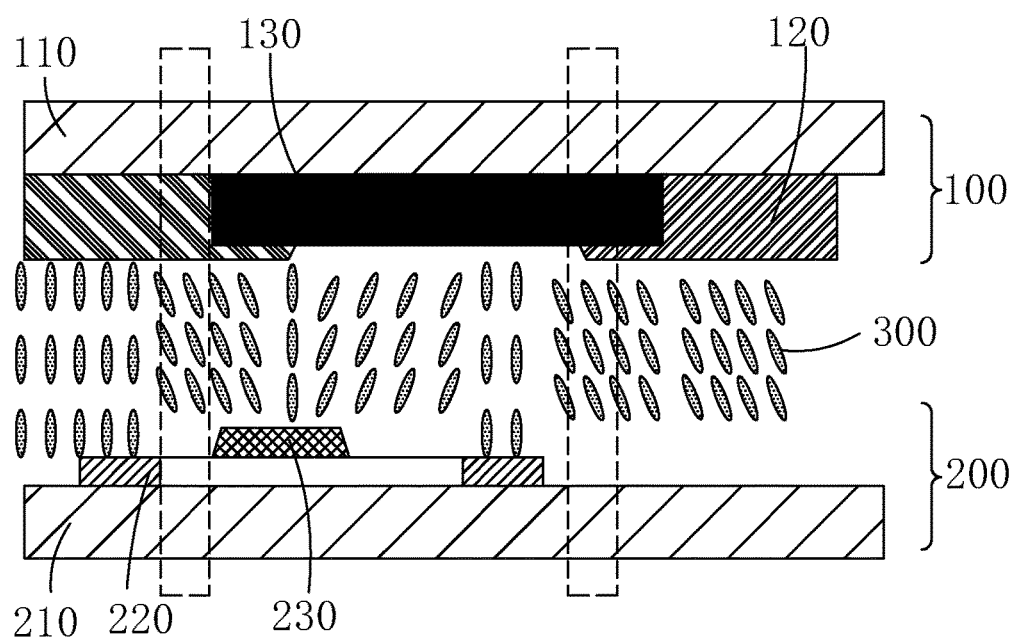
FIG. 2 is a partial and sectional structure diagram of a liquid crystal panel shown in FIG. 1 when it is applied for curve display.
Figure 3:
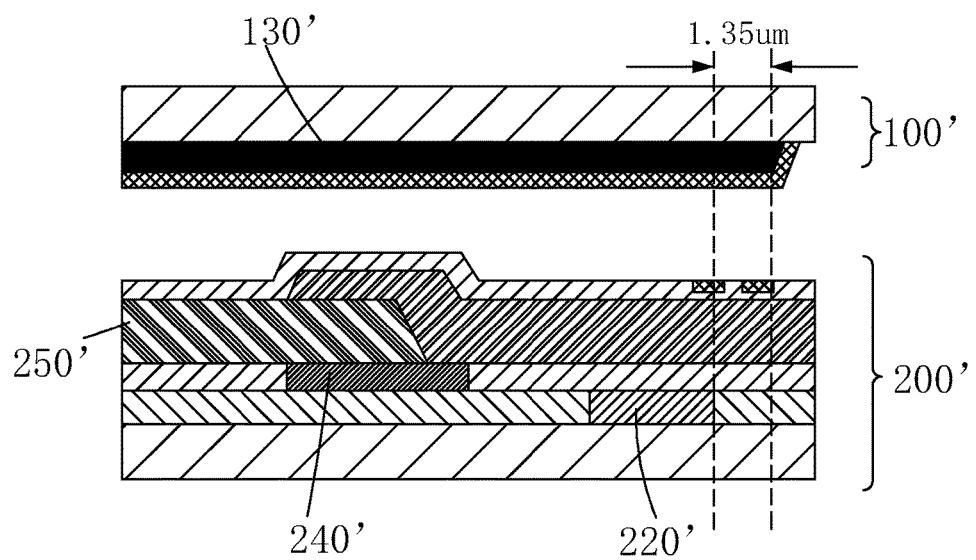
FIG. 3 is a sectional structure diagram of a COA liquid crystal panel according to prior art.
Figure 4:
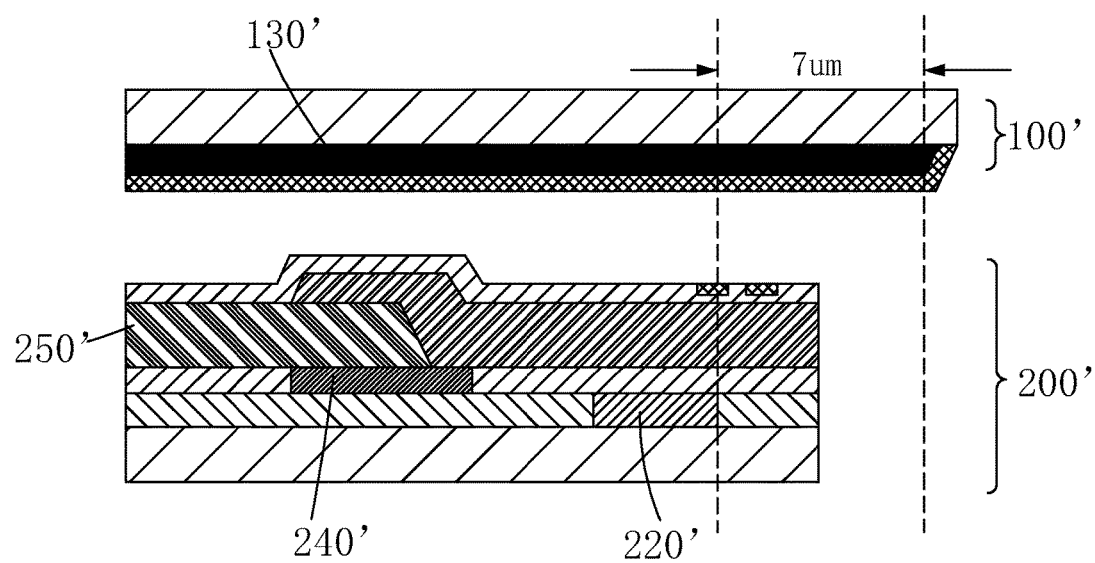
FIG. 4 is a sectional structure diagram of the COA liquid crystal panel in FIG. 3 after improvement.
Figure 5:
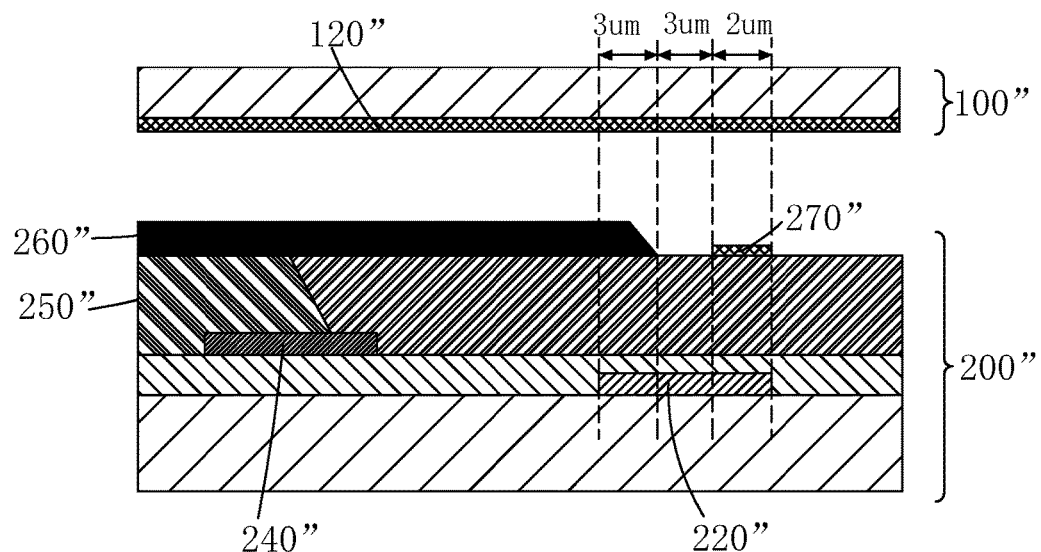
FIG. 5 is a sectional structure diagram of a BOA liquid crystal panel according to prior art.

Specifically, the width of the light shielding line 22 is 6.5 μm. In comparison with the BOA liquid crystal panel according to prior art in FIG. 5, the width of the light shielding line 22 is shortened from 8 μm to 6.5 μm, which effectively raises the aperture ratio of the BOA liquid crystal panel.

Specifically, the pixel electrode 27 and the black matrix 26 are spaced with each other in the horizontal direction. The risk of generating the fringes due to the liquid crystal tilt inside the pixel caused by the uneven appearance because of the shift of the black matrix 26 can be eliminated. Specifically, a distance of the black matrix 26 and the pixel electrode 27 in the horizontal direction is 3 μm.

Specifically, the light shielding line 22 is located at a position of the gap between the black matrix 26 and the pixel electrode 27 in the horizontal direction, and the pixel electrode 27 covers a portion of the light shielding line 22, and the light shielding line 22 is employed to cover the light emitted by the backlight source and can reduce the capacitance between the data line 24 and the pixel electrode 27. Thus, the voltage interference between the data line 24 and the pixel electrode 27 is reduced. Specifically, a range of the light shielding line 22 covered by the pixel electrode 27 in the horizontal direction is 2 μm.

Specifically, the first substrate 11 and the second substrate 12 are glass substrates.

Specifically, material of the common electrode 12 and the pixel electrode 27 is ITO (Indium Tin Oxide).

In conclusion, in the BOA liquid crystal panel of the present invention, both the color resist layer and the black matrix are located on the second substrate, the borders of the two adjacent color resist blocks in the color resist layer overlap to act the effect of light shielding and on this basis, a layer of black matrix is covered to achieve the double layer shielding, which effectively prevents the light leakage due to the exposure of the gap between the data line and the light shielding line when the BOA liquid crystal panel is applied for curve display and meanwhile, shortens the width of the light shielding line. The aperture ratio of the BOA liquid crystal panel is raised to reduce the cost of the backlight.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A BOA liquid crystal panel, comprising an upper substrate, a lower substrate oppositely located to the upper substrate and a liquid crystal layer located between the upper substrate and the lower substrate;
   the upper substrate comprises a first substrate, and a common electrode located on the first substrate;
   the lower substrate comprises a second substrate, a light shielding line, a data line, a color resist layer covering the data line, a black matrix located on the color resist layer and a pixel electrode;
   the color resist layer comprises a red color resist block, a green color resist block and a blue color resist block located in sequence, and borders of two adjacent color resist blocks overlap with each other, and the data line is located at a joint position of the two adjacent color resist blocks; the data line and the light shielding line are spaced with each other in a horizontal direction, and the black matrix completely covers a gap between the data line and the light shielding line and covers a portion of the light shielding line, wherein a width of the light shielding line is 6.5 μm.

2. The BOA liquid crystal panel according to claim 1, wherein a range of the light shielding line covered by the black matrix in the horizontal direction is 1.5 μm.

3. The BOA liquid crystal panel according to claim 1, wherein the pixel electrode and the black matrix are spaced with each other in the horizontal direction.

4. The BOA liquid crystal panel according to claim 3, wherein a distance of the black matrix and the pixel electrode in the horizontal direction is 3 μm.

5. The BOA liquid crystal panel according to claim 3, wherein the light shielding line is located at a position of the gap between the black matrix and the pixel electrode in the horizontal direction.

6. The BOA liquid crystal panel according to claim 1, wherein the pixel electrode covers a portion of the light shielding line.

7. The BOA liquid crystal panel according to claim 6, wherein a range of the light shielding line covered by the pixel electrode in the horizontal direction is 2 μm.

8. The BOA liquid crystal panel according to claim 1, wherein the first substrate, the second substrate are glass substrates.

9. The BOA liquid crystal panel according to claim 1, wherein material of the common electrode and the pixel electrode is ITO.

10. A BOA liquid crystal panel, comprising an upper substrate, a lower substrate oppositely located to the upper substrate and a liquid crystal layer located between the upper substrate and the lower substrate;
    the upper substrate comprises a first substrate, and a common electrode located on the first substrate;
    the lower substrate comprises a second substrate, a light shielding line, a data line, a color resist layer covering the data line, a black matrix located on the color resist layer and a pixel electrode;
    the color resist layer comprises a red color resist block, a green color resist block and a blue color resist block located in sequence, and borders of two adjacent color resist blocks overlap with each other, and the data line is located at a joint position of the two adjacent color resist blocks; the data line and the light shielding line are spaced with each other in a horizontal direction, and the black matrix completely covers a gap between the data line and the light shielding line and covers a portion of the light shielding line;
    wherein a range of the light shielding line covered by the black matrix in the horizontal direction is 1.5 μm;
    wherein the pixel electrode and the black matrix are spaced with each other in the horizontal direction;
    wherein the pixel electrode covers a portion of the light shielding line;
    wherein a width of the light shielding line is 6.5 μm;
    wherein the first substrate, the second substrate are glass substrates;
    wherein material of the common electrode and the pixel electrode is ITO.

11. The BOA liquid crystal panel according to claim 10, wherein a distance of the black matrix and the pixel electrode in the horizontal direction is 3 μm.

12. The BOA liquid crystal panel according to claim 10, wherein the light shielding line is located at a position of the gap between the black matrix and the pixel electrode in the horizontal direction.

13. The BOA liquid crystal panel according to claim 10, wherein a range of the light shielding line covered by the pixel electrode in the horizontal direction is 2 μm.

* * * * *